United States Patent [19]

Meetham et al.

[11] Patent Number: 4,626,297
[45] Date of Patent: Dec. 2, 1986

[54] SINGLE-CRYSTAL ALLOY

[75] Inventors: Geoffrey W. Meetham, Allestree; Michael J. Goulette, Mickleover; Roger P. Arthey, Melbourne, all of England

[73] Assignee: Rolls-Royce plc, London, England

[21] Appl. No.: 538,844

[22] Filed: Oct. 5, 1983

Related U.S. Application Data

[63] Continuation of Ser. No. 242,827, Mar. 12, 1981, abandoned.

[30] Foreign Application Priority Data

Mar. 13, 1980 [GB] United Kingdom ............... 8008579

[51] Int. Cl.$^4$ .......................................... C22C 19/05
[52] U.S. Cl. ...................................... 148/404; 148/410
[58] Field of Search ............... 420/448; 148/404, 410, 148/428

[56] References Cited

U.S. PATENT DOCUMENTS 4,116,723  9/1978  Gell et al. ..................... 148/32.5
4,209,348  6/1980  Duhl et al. .................... 148/32.5

Primary Examiner—R. Dean
Attorney, Agent, or Firm—Cushman, Darby & Cushman

[57] ABSTRACT

The invention relates to an alloy suitable for making single-crystal castings and to a casting made thereof. The alloy comprises, by weight percent, Chromium 10–16%, Cobalt 4–16%, Molybdenum 2–4%, Tungsten 0–2%, Tantalum 2–8%, the sum of $$\text{Molybdenum \%} + \frac{\text{Tungsten \%}}{2} + \frac{\text{Tantalum \%}}{3}$$

lying between 5 and 7%, Aluminium 4–6%, Titanium 1–4% the sum of $$\text{Aluminium \%} + \frac{\text{Titanium \%}}{2}$$

lying between 5 and 7%. Carbon 0.015–0.05%, Boron 0–0.01%, Zirconium 0–0.01%, the balance being nickel plus incidental impurities.

5 Claims, No Drawings

SINGLE-CRYSTAL ALLOY

CROSS REFERENCE TO RELATED APPLICATIONS

This application is a continuation of our earlier application Ser. No. 242,827 filed Mar. 12, 1981 and now abandoned.

This invention relates to an alloy suitable for making single-crystal castings, and to a casting made thereof.

It has been understood for some years that nickel-based alloys, when made in the form of single crystal castings, offer a potentially improved combination of properties of strength and corrosion resistance. This is mainly due to the lack of grain boundaries in the single-crystal structure, these boundaries in normal cast materials forming initiating features and propagation paths for cracks and weak points for corrosion to attack.

Recently the use of single-crystal castings in gas turbine engines has been widely studied, with the main effort being directed toward the use of such castings for the high pressure turbine rotor blades of the engine. In order to optimise the material properties of these cast blades modified versions of the nickel-based superalloys normally used for the blades have been proposed.

We have appreciated that the single-crystal casting technique can be used to give enhanced properties to other parts of the gas turbine, in particular the nozzle guide vanes which direct hot gases from the combustion system on to the turbine rotor blades. The properties required for the metal of which these vanes are made differ from those required for the rotor blades; thus for instance high melting point and good oxidation resistence are more important in the vane materials while the strength of the material is less important.

In order to allow the single-crystal casting process to achieve more of its potential benefit when applied to structures such as nozzle guide vanes, we have invented an alloy adapted, in the single-crystal form, to provide good values for the required properties.

According to the present invention an alloy suitable for use in the form of a single-crystal casting comprises the following constituents by weight percent:

| | |
|---|---|
| Chromium | 10–16% |
| Cobalt | 4–16% |
| Molybdenum | 2–4% |
| Tungsten | 0–2% |
| Tantalum | 2–8% |

The sum of $$\text{Molybdenum \%} + \frac{\text{Tungsten \%}}{2} + \frac{\text{Tantalum \%}}{3}$$

lying between 4 and 6.

| | |
|---|---|
| Aluminium | 4–6% |
| Titanium | 1–4% |

The sum of $$\text{Aluminium \%} + \frac{\text{Titanium \%}}{2}$$

lying between 5 and 7.

| | |
|---|---|
| Carbon | 0.015–0.05% |
| Boron | 0–0.01% |
| Zirconium | 0–0.01% |

Balance nickel plus incidental impurities

Preferably the alloy comprises by weight percent

| | |
|---|---|
| Chromium | 11–12% |
| Cobalt | 4–12% |
| Molybdenum | 2.0–2.5% |
| Tungsten | 0.5–1% |
| Tantalum | 5–6% |
| Aluminium | 5–5.5% |
| Titanium | 1.5–2% |
| Carbon | 0.015–0.05% |
| Boron | 0–0.01% |
| Zirconium | 0–0.01% |

Balance Nickel plus incidental impurities

Particular embodiments comprised

| | |
|---|---|
| Chromium | 11.5% |
| Cobalt | 10% |
| Molybdenum | 2.25% |
| Tungsten | 0.75% |
| Tantalum | 5.5% |
| Aluminium | 5.25 or 4% |
| Titanium | 1.75 or 3.5% |
| Carbon | 0.02% |

Balance Nickel plus incidental impurities.

The invention also comprises a single-crystal casting, and in particular a nozzle guide vane for a gas turbine engine made in the form of a single-crystal casting, made of the alloy.

The significance of the various constituents in the application of the alloy to a single-crystal casting role will now be discussed in the order in which the constituents are set out in the claim.

Firstly, the Chromium content at 10–16% is relatively low when compared with other cast nozzle guide vane alloys. This together with the relatively high Aluminium content at 4–6% provides an alloy in which the film of oxide on the surface of the casting is of Aluminium oxides rather than an oxide of Chromium. This gives the alloy better high temperature oxidation resistance at the expense of slightly worse hot corrosion resistance. However, the balance between these two factors is such in our alloy as to be optimum for its proposed use.

The Cobalt levels are judged to provide a sufficient amount of this important alloying element while acknowledging its high cost which makes it desirable to reduce the amount used to as low a level as possible commensurate with achieving the desired properties.

The three strengthening additions Molybdenum, Tungsten and Tantalum must be present in certain quantities to give sufficient strength to the alloy, but if they exceed a certain level the alloy can become unstable. At the same time the addition of Tantalum is beneficial to the high temperature oxidation properties of the alloy, hence we prefer to use a relatively high Tantalum content with relatively low Molybdenum and Tungsten contents, subject to limits to a sum of the amounts of these three elements factored to take account of their contributions to the stability of the alloy.

It will be understood by those skilled in the art that it is possible, within the ranges claimed, to choose alloys with varying degrees of stability and some may be relatively unstable. However, even unstable alloys have proved useful and one skilled in the art would be expected to choose values within the claimed ranges which give the desired degree of stability.

The Aluminium content of the alloy is relatively high to encourage the formation of Aluminium oxides as a surface coating on the alloy referred to above. This maximises the high temperature oxidation resistance particularly when accompanied by a relatively low titanium content. A higher titanium content combined with reduced aluminium content tends to improve hot corrosion resistance, other things being equal. The ranges selected for our alloy are such as to be optimised for its proposed use. Again the levels of Aluminium and Titanium are subject to a balance factor calculation which is factored to take their effects into account, the lower level representing a level at which the strength of the alloy will be affected and the upper being determined by stability considerations.

The minor constituents Carbon, Boron and Zirconium are present in normal superalloys to strengthen the grain boundaries. In the case of a single crystal casting there are no grain boundaries within the material and therefore these constituents need not be present for this purpose. In addition Boron and Zirconium act as melting point depressants, and since it is desirable that the alloy should have as high a melting point as possible, it is best if these additives are reduced to as low a level as is possible. Similarly the Carbon content should be low, but in this case it is not vital that an extremely low level should be achieved and a lowest level of 0.015% is quoted, this being relatively easily achieved in practice without the need for expensive de-carburising techniques. The balance of the alloy is of course Nickel but there will inevitably be impurities in the material which can be tolerated as long as they do not provide a deleterious effect.

It will be seen therefore that the range of constituents in accordance with the invention provides alloys optimised to allow at least some of the potential benefits of the single crystal casting technique to be realised while the opportunity is also taken to modify the constituents to provide other improved properties compared with the prior art alloys. Although this range of alloys is specifically intended to be used for cast single-crystal nozzle guide vanes for gas turbine engines, it is clear that the properties of the alloy are such that it could be used for other single-crystal artefacts.

In order to prove the properties of alloys made in accordance with the invention, test results were obtained for a control alloy which is in current use as a cast superalloy and two alloys within our claimed ranges. The alloys had the following constituents by weight percent (it should be noted that the constituents of alloys 1 and 2 represent target figures and that the actual figures may differ slightly).

|  | Control | Alloy 1 | Alloy 2 |
|---|---|---|---|
| Chromium | 15 | 11.5 | 11.5 |
| Cobalt | 10 | 10 | 10 |
| Molybdenum | 8 | 2.25 | 2.25 |
| Tungsten | — | 0.75 | 0.75 |
| Tantalum | — | 5.5 | 5.5 |
| Aluminium | 4.40 | 5.25 | 4.0 |
| Titanium | 3.5 | 1.75 | 3.5 |
| Carbon | 0.15 | 0.02 | 0.02 |
| Boron | 0.005 | — | — |
| Zirconium | — | — | — |
| Nickel | balance | balance | balance |

It will be noted that the Molybdenum/Tungsten/Tantalum balance factor of both alloys 1 and 2 is 4.46 while the Aluminium/Titanium factor for alloy 1 is 6.12 and for alloy 2 is 5.75. In all cases the control alloy results were for a conventionally cast test piece while alloys 1 and 2 were tested as single crystal castings. In all cases appropriate heat treatments were given, including a solution treatment at temperatures above the gamma prime solvus but below the melting point. For alloys 1 and 2 the solution treatment temperatures were 1220° C. and 1270° C. respectively and this temperature was held for 1 hour. This was followed by a conventional ageing step at 870° C. for 16 hours.

The alloys were tested for oxidation resistance, ultimate tensile strength and stress rupture properties at differing temperatures.

The results for the oxidation resistance were as follows, the test being carried our in air with 4 parts per million of salt and at a temperature of 1050° C.

|  | depth of attack after 30 hrs | depth of attack after 90 hrs |
|---|---|---|
| Control | 38 microns | 208 microns |
| Alloy 1 | 25 microns | 98 microns |
| Alloy 2 | 24 microns | 103 microns |

It will be seen that Alloys 1 and 2 both provide greater resistance to oxidation than the control alloy, and it is of interest to note that the attack of alloys 1 and 2 is more uniform than that of the control, which is clearly advantageous.

In the ultimate tensile strength results the results were as follows:

|  | ultimate tensile strength room temperature | ultimate tensile strength 800° C. |
|---|---|---|
| Control | 1000 MPa | 950 MPa |
| Alloy 1 | 1090 MPa | 1080 MPa |
| Alloy 2 | 1030 MPa | 1070 MPa |

The differences between these results are not statistically significant but they do demonstrate that Alloys 1 and 2 are not weaker than the control.

Finally a comparison was made between the stress rupture life of Alloy 1 and the control alloy at various temperatures. The results were:

|  | Life at 750° C. and 580 MPa load | Life at 850° C. and 340 MPa load | Life at 1050° C. and 75 MPa load |
|---|---|---|---|
| Control | 45 hrs | 30 hrs | 35 hrs |
| Alloy | 250 hrs | 250 hrs | 250 hrs |

It will be seen that the stress rupture results show a marked improvement; we estimate that the increase in life represents a 40° to 50° C. increase in potential operating temperature for objects made of the alloy.

In general therefore these test results confirm our predictions that the alloys of the invention provide similar strength to the prior art alloy but improved corrosion and high temperature resistance.

We claim:

1. A single crystal alloy suitable for use in the form of a single-crystal casting consisting essentially of the following constituents by weight percent:

| | |
|---|---|
| Chromium | 11–12% |
| Cobalt | 4–12% |
| Molybdenum | 2.0–2.5% |
| Tungsten | 0.5–1.0% |
| Tantalum | 5–6% |

The sum of $$\text{Molybdenum \%} + \frac{\text{Tungsten \%}}{2} + \frac{\text{Tantalum \%}}{3}$$

lying between 4 and 6

| | |
|---|---|
| Aluminium | 4–5.5% |
| Titanium | 1.5–3.5% |

The sum of $$\text{Aluminium \%} + \frac{\text{Titanium \%}}{2}$$

lying between 5 and 7

| | |
|---|---|
| Carbon | 0.015–0.05% |
| Boron | 0–0.01% |
| Zirconium | 0–0.01% | balance essentially Nickel plus incidental impurities.

2. A single crystal alloy as claimed in claim 1 consisting essentially of the following constituents by weight percent:

| | |
|---|---|
| Chromium | 11.5% |
| Cobalt | 10% |
| Molybdenum | 2.25% |
| Tungsten | 0.75% |
| Tantalum | 5.5% |
| Aluminium | 5.25% |
| Titanium | 1.75% |
| Carbon | 0.02% |

Balance essentially Nickel plus incidental impurities.

3. A single crystal alloy as claimed in claim 1 and consisting essentially of the following constituents by weight percent:

| | |
|---|---|
| Chromium | 11.5% |
| Cobalt | 10% |
| Molybdenum | 2.25% |
| Tungsten | 0.75% |
| Tantalum | 5.5% |
| Aluminium | 4% |
| Titanium | 3.5% |
| Carbon | 0.02% |

Balance essentially Nickel plus incidental impurities.

4. A single-crystal casting made of the alloy claimed in claim 1, 3 or 2.

5. A nozzle guide vane for a gas turbine engine in the form of a single-crystal casting as claimed in claim 4.

* * * * *